US012637615B2

(12) United States Patent
Yamazaki et al.

(10) Patent No.: US 12,637,615 B2
(45) Date of Patent: May 26, 2026

(54) MICROPROCESSING TREATMENT AGENT AND MICROPROCESSING TREATMENT METHOD

(71) Applicant: STELLA CHEMIFA CORPORATION, Osaka (JP)

(72) Inventors: Yosuke Yamazaki, Osaka (JP); Kenta Horigami, Osaka (JP); Kazuya Date, Osaka (JP); Rui Hasebe, Osaka (JP); Keiichi Nii, Osaka (JP); Tetsuo Nishida, Osaka (JP)

(73) Assignee: STELLA CHEMIFA CORPORATION (JP)

( * ) Notice: Subject to any disclaimer, the term of this patent is extended or adjusted under 35 U.S.C. 154(b) by 239 days.

(21) Appl. No.: 18/559,459

(22) PCT Filed: Jun. 11, 2021

(86) PCT No.: PCT/JP2021/022411
§ 371 (c)(1),
(2) Date: Nov. 7, 2023

(87) PCT Pub. No.: WO2022/244275
PCT Pub. Date: Nov. 24, 2022

(65) Prior Publication Data
US 2024/0240084 A1 Jul. 18, 2024

(30) Foreign Application Priority Data

May 20, 2021 (JP) ................................. 2021-085435

(51) Int. Cl.
C09K 13/08 (2006.01)
H10P 50/28 (2026.01)

(52) U.S. Cl.
CPC ............ *C09K 13/08* (2013.01); *H10P 50/283* (2026.01)

(58) Field of Classification Search
None
See application file for complete search history.

(56) References Cited

U.S. PATENT DOCUMENTS

| | | | |
|---|---|---|---|
| 4,582,624 A | 4/1986 | Enjo et al. | |
| 4,795,582 A | 1/1989 | Ohmi et al. | |
| 5,803,956 A * | 9/1998 | Ohmi ..................... | C09K 13/08 257/E21.228 |
| 2003/0036569 A1 | 2/2003 | Lemanna et al. | |
| 2004/0089840 A1 * | 5/2004 | Parent .................... | C09K 13/08 252/79.1 |
| 2004/0112753 A1 * | 6/2004 | Kesari ...................... | C09G 1/02 257/E21.309 |
| 2008/0125342 A1 * | 5/2008 | Visintin ................... | C11D 3/08 257/E21.646 |
| 2010/0112728 A1 * | 5/2010 | Korzenski ......... | H01L 21/02079 257/E21.294 |
| 2012/0056126 A1 | 3/2012 | Miyashita et al. | |

FOREIGN PATENT DOCUMENTS

| | | |
|---|---|---|
| CN | 1608037 A | 4/2005 |
| CN | 102473636 A | 5/2012 |
| CN | 106010826 A | 10/2016 |
| JP | S60-039176 A | 2/1985 |
| JP | S63-283028 A | 11/1988 |
| JP | H07-211707 A | 8/1995 |
| JP | 2004-533511 A | 11/2004 |
| JP | 2006-505667 T | 2/2006 |
| JP | 2008-124135 A | 5/2008 |
| JP | 2009-105341 A | 5/2009 |

(Continued)

OTHER PUBLICATIONS

International Search Report mailed Aug. 31, 2021 in corresponding PCT International Application No. PCT/JP2021/022411.

(Continued)

*Primary Examiner* — Shamim Ahmed
(74) *Attorney, Agent, or Firm* — OSTROLENK FABER LLP

(57) ABSTRACT

A micromachining processing agent that contains hydrogen fluoride, ammonium fluoride. water and a compound represented by the chemical formula (1) below:

$$M^+ \cdot (Rf\text{-}SO_2) \longrightarrow N^- \longrightarrow (SO_2\text{-}Rf) \qquad (1)$$

Rf representing perfluoroalkyl group having 1 to 4 carbon atoms, and $M^+$ representing a hydrogen ion or an ammonium ion, the content of the compound being 0.001 mass % or more and 0.5 mass % or less with respect to a total mass of the micromachining processing agent, the content of the hydrogen fluoride being 0.05 mass % or more and 25 mass % or less with respect to a total mass of the micromachining processing agent, the content of the ammonium fluoride being 0.5 mass % or more and 40 mass % or less with respect to a total mass of the micromachining processing agent, and the content of the hydrogen fluoride and the content of the ammonium fluoride satisfying the relational expression (1) below:

$$Y \leq -0.8X + 40 \qquad (1)$$

X representing a concentration (mass %) of hydrogen fluoride and Y representing a concentration (mass %) of ammonium fluoride.

4 Claims, No Drawings

(56) References Cited

FOREIGN PATENT DOCUMENTS

| JP | 2009-212347 | A |  | 9/2009 | | |
|----|----|----|----|----|----|----|
| JP | WO 2010/134184 | A1 |  | 11/2010 | | |
| JP | 4940102 | B2 | * | 5/2012 | | |
| JP | 2013-004871 | A |  | 1/2013 | | |
| TW | 201600585 | A |  | 1/2016 | | |
| WO | WO-2019044476 | A1 | * | 3/2019 | .......... | C07C 311/48 |
| WO | WO 2020/084854 | A1 |  | 4/2020 | | |

OTHER PUBLICATIONS

Office Action mailed Aug. 17, 2021 in corresponding Japanese Application No. 2021-085435.
Office Action mailed Aug. 16, 2022 in corresponding Taiwanese Application No. 110126935.
Decision of Refusal mailed Apr. 18, 2023 in corresponding Taiwanese Application No. 110126935.
Office Action mailed Oct. 9, 2022 in corresponding Chinese Application No. 202180002940.2.
Kazuhisa Hirata et al., "Passivation Behavior of Aluminum in a Carbonate-Free Electrolyte Based on Lithium Bis(fluorosulfonyl)imide and Sulfolane", Journal of The Electrochemical Society, 2020, vol. 167, No. 14.
Han, Hongbo, "Alkali Salts and Ionic Liquids Based on Fluorosulfonyl Imide: Synthesis, Characterization, and Their Application in Li-ion Batteries", Full-text database of Chinese doctoral theses Engineering Science and Technology II, 2012.

* cited by examiner

MICROPROCESSING TREATMENT AGENT AND MICROPROCESSING TREATMENT METHOD

CROSS-REFERENCE TO RELATED APPLICATIONS

The present application is a 35 U.S.C. §§ 371 national stage application of International Application No. PCT/JP2021/022411, filed Jun. 11, 2021, which claims priority to Japanese Patent Application No. 2021-085435, filed May 20, 2021, the contents of which are incorporated herein by reference.

TECHNICAL FIELD

The present invention relates to a micromachining processing agent and a micromachining processing method used for wet etching processing and the like in the production of semiconductor devices, liquid crystal display devices, and micro machine devices (micro electro mechanical systems; MEMS) and the like. The present invention more specifically relates to a micromachining processing agent suitable for micromachining such as wet etching processing on an object to be processed having at least a silicon-containing insulating film, and a micromachining processing method.

BACKGROUND ART

In the production process of a semiconductor element, there is a process of patterning and etching an insulating film such as a silicon oxide film, a silicon nitride film, a silicon alloy, a polysilicon film, a metal film, or the like formed on the surface of a silicon wafer into a desired shape. In a case where this etching processing is performed by a wet etching method, for example, when an insulating film containing silicon, such as a silicon oxide film is an etching target, a solution prepared by mixing hydrofluoric acid and ammonium fluoride, so-called buffered hydrofluoric acid is used.

Here, in the production process of a semiconductor element, fine particles of an organic substance, an inorganic substance such as metals, and the like derived from a production apparatus or materials used may adhere to and remain on the silicon surface. For example, in the case of batch wet etching, there is a problem that fine particles adhering in the previous process are mixed into an etching tank where wet etching is performed, and adhere to and remain on the surface of the silicon wafer or the like after wet etching processing. The fine particles remaining on the surface of the silicon wafer or the like adversely affect the electrical characteristics of the semiconductor element, and may lower the product yield of the semiconductor device.

In view of such problems, for example, Patent Documents 1 to 4 propose prevention of remaining of fine particles on the surface of a silicon wafer or the like, using an etching solution prepared by adding a surfactant to buffered hydrofluoric acid. The etching solution disclosed in these patent documents is considered to be capable of suppressing adhesion of fine particles to the surface of the silicon wafer or the like by blending a surfactant.

However, with the rapid progress of recent technologies, miniaturization of the semiconductor element has progressed, and the line width of the semiconductor element has been reduced. For example, taking a dynamic random access memory (DRAM) as an example, the process node (the minimum line width of the element) reaches close to 10 nm.

Therefore, even fine particles remaining on the surface of the silicon wafer or the like are required to be prevented from remaining up to extremely fine particles having a small particle size. However, it is difficult for the etching solutions disclosed in Patent Documents 1 to 4 to sufficiently suppress remaining of fine particles having a small particle size.

CITATION LIST

Patent Document

Patent Document 1: JP-A-63-283028
Patent Document 2: JP-A-7-211707
Patent Document 3: JP-A-60-39176
Patent Document 4: JP-T-2006-505667

SUMMARY OF THE INVENTION

Problems to be Solved by the Invention

The present invention has been made in view of the above problems, and an object of the present invention is to provide a micromachining processing agent and a micromachining processing method that enable favorable micromachining while suppressing remaining of fine particles on an object to be processed having at least a silicon-containing insulating film.

Solutions to the Problems

In order to solve the above problems, a micromachining processing agent of the present invention is a micromachining processing agent for micromachining an object to be processed having at least a silicon-containing insulating film, the micromachining processing agent comprising: a compound represented by a chemical formula (1) below; hydrogen fluoride; ammonium fluoride; and water,

[Chemical Formula 1]

$$M^+ \cdot (Rf\text{-}SO_2) - N^- - (SO_2\text{-}Rf) \tag{1}$$

wherein Rf represents perfluoroalkyl group having 1 to 4 carbon atoms, and $M^+$ represents a hydrogen ion or an ammonium ion, wherein a content of the compound is 0.001 mass % or more and 0.5 mass % or less with respect to a total mass of the micromachining processing agent, a content of the hydrogen fluoride is 0.05 mass % or more and 25 mass % or less with respect to the total mass of the micromachining processing agent, a content of the ammonium fluoride is 0.5 mass % or more and 40 mass % or less with respect to the total mass of the micromachining processing agent, and the content of the hydrogen fluoride and the content of the ammonium fluoride satisfy a relational expression (1) below:

[Mathematical Formula 1]

$$Y \leq -0.8X + 40 \tag{1}$$

wherein X represents a concentration (mass %) of hydrogen fluoride and Y represents a concentration (mass %) of ammonium fluoride.

According to the above configuration, the compound represented by Chemical Formula (1) is contained in an amount of 0.001 mass % or more with respect to the total mass of the micromachining processing agent. Such a configuration makes it possible to perform micromachining such as wet etching on an object to be processed having at least a silicon-containing insulating film while suppressing or reducing adhesion and remaining of fine particles (impurities) of an organic substance or an inorganic substance on the surface of the object to be processed. When the compound is contained in an amount of 0.5 mass % or less with respect to the total mass of the micromachining processing agent, it is possible to suppress an increase in micelles formed by aggregation of the compound. As a result, the micelles can be prevented from remaining on the surface of the object to be processed. In addition, the micromachining processing agent having the above configuration can also improve stability against a change in the composition of the micromachining processing agent over time and controllability of etching on the silicon-containing insulating film.

In the above configuration, it is preferred that the silicon-containing insulating film is a thermal silicon oxide film, and an etch rate for the thermal silicon oxide film at an etching temperature of 25° C. is 0.5 nm/min to 700 nm/min.

The micromachining processing agent having the above configuration can satisfactorily maintain the production efficiency of micromachining on an object to be processed having a thermal silicon oxide film. In addition, the micromachining processing agent having the above configuration can also suppress a decrease in controllability of the film thickness of the thermal silicon oxide film by micromachining.

Further, in the above configuration, it is preferred that Rf in the compound represented by the chemical formula (1) is a nonafluorobutyl group, the content of the compound is 0.001 mass % or more and 0.03 mass % or less with respect to the total mass of the micromachining processing agent, the content of the hydrogen fluoride is 0.05 mass % or more and 3 mass % or less with respect to the total mass of the micromachining processing agent, and the content of the ammonium fluoride is 0.5 mass % or more and 10 mass % or less with respect to the total mass of the micromachining processing agent.

According to the above configuration, micromachining such as wet etching can be favorably performed on a silicon-containing insulating film while further reducing or suppressing adhesion of fine particles (impurities) to the object to be processed. In addition, the micromachining processing agent having the above configuration can further improve stability against a change in the composition of the micromachining processing agent over time and controllability of etching on the silicon-containing insulating film.

In order to solve the above problems, a micromachining processing method of the present invention comprises micromachining an object to be processed having at least a silicon-containing insulating film using the micromachining processing agent.

According to the above configuration, it is possible to perform micromachining such as wet etching on an object to be processed having at least a silicon-containing insulating film while suppressing or reducing adhesion of fine particles (impurities) using the micromachining processing agent described above. As a result, the micromachining processing method having the above configuration can improve the yield in the semiconductor production process.

Effects of the Invention

According to the present invention, it is possible to provide a micromachining processing agent and a micromachining processing method that enable micromachining processing such as wet etching on an object to be processed having at least a silicon-containing insulating film while suppressing adhesion and remaining of fine particles (impurities) on the object to be processed.

EMBODIMENTS OF THE INVENTION (Micromachining Processing Agent)

A micromachining processing agent according to an embodiment of the present invention will be described below.

The micromachining processing agent according to the present embodiment contains at least a compound represented by the following chemical formula (1), hydrogen fluoride, ammonium fluoride, and water.

[Chemical Formula 2]

$$M^+ \cdot (Rf\text{-}SO_2) \text{---} N^- \text{---} (SO_2\text{-}Rf) \tag{1}$$

where Rf represents perfluoroalkyl group having 1 to 4 carbon atoms, and $M^+$ represents a hydrogen ion or an ammonium ion.

When the micromachining processing agent of the present embodiment contains a compound represented by the chemical formula (1), it is possible to perform micromachining while suppressing adhesion and remaining of fine particles on the object to be processed. In addition, when the micromachining processing agent contains a compound represented by the chemical formula (1), the surface tension of the micromachining processing agent is reduced to improve the wettability to a surface to be micromachined or the like. As a result, even when fine unevennesses are present on the surface of the object to be processed, the micromachining processing agent can exhibit good wettability and excellent micromachining performance.

Here, in the present specification, the term "fine particle" includes, for example, organic substances as impurities such as an eluate (more specifically, for example, a plasticizer eluted from a rubber member such as an O-ring) from the manufacturing apparatus used in the semiconductor manufacturing process, materials used, and the like. The term "fine particle" also includes organic substances contained in various treatment liquids used in the semiconductor production process, fine particles (particles) formed from inorganic substances such as metal components as a core, and the like.

In the present specification, the term "micromachining" includes etching processing for micromachining the surface of an object to be processed, cleaning processing of the surface of an object to be processed, and the like. When the object to be processed is etched, the micromachining processing agent of the present embodiment functions as an etching solution. When the object to be processed is cleaned, the micromachining processing agent of the present embodiment functions as a cleaning solution.

Further, in the present specification, the term "perfluoroalkyl group" in the chemical formula (1) means a completely fluorinated monovalent saturated hydrocarbon group, and means a linear, branched, or cyclic group. The expression "1 to 4 carbon atoms" in the "perfluoroalkyl group having 1 to 4 carbon atoms" means all the numbers of carbon atoms included in the range. That is, the above expression includes all perfluoroalkyl groups having 1, 2, 3, and 4 carbon atoms. Examples of the "perfluoroalkyl group having 1 to 4 carbon atoms" include a trifluoromethyl group; a pentafluoroethyl group; an n-heptafluoropropyl group, an iso-heptafluoropropyl group; and a nonafluorobutyl groups such as an n-nonafluorobutyl group, an iso-nonafluorobutyl group, a sec-nonafluorobutyl group, and a tert-nonafluorobutyl group. Among them, a nonafluorobutyl group is preferable from the viewpoint of suppressing or reducing adhesion of fine particles to enable micromachining while suppressing the addition amount of the compound represented by the chemical formula (1).

In the compound represented by the chemical formula (1), specific compounds in a case where $M^+$ is a hydrogen ion are as follows.

$$H^+ \bullet (CF_3 \text{---} SO_2) \text{---} N^- \text{---} (SO_2 \text{---} CF_3)$$

$$H^+ \bullet (C_2F_5 \text{---} SO_2) \text{---} N^- \text{---} (SO_2 \text{---} C_2F_5)$$

$$H^+ \bullet (C_3F_7 \text{---} SO_2) \text{---} N^- \text{---} (SO_2 \text{---} C_3F_7)$$

$$H^+ \bullet (C_4F_9 \text{---} SO_2) \text{---} N^- \text{---} (SO_2 \text{---} C_4F_9)$$

Among these compounds, a compound represented by the following chemical formula is particularly preferable from the viewpoint of suppressing or reducing adhesion of fine particles to enable micromachining while suppressing the addition amount of the compound.

$$H^+ \bullet (C_4F_9 \text{---} SO_2) \text{---} N^- \text{---} (SO_2 \text{---} C_4F_9)$$

In the compound represented by the chemical formula (1), specific compounds in a case where $M^+$ is an ammonium ion are as follows.

$$NH_4^+ \bullet (CF_3 \text{---} SO_2) \text{---} N^- \text{---} (SO_2 \text{---} CF_3)$$

$$NH_4^+ \bullet (C_2F_5 \text{---} SO_2) \text{---} N^- \text{---} (SO_2 \text{---} C_2F_5)$$

$$NH_4^+ \bullet (C_3F_7 \text{---} SO_2) \text{---} N^- \text{---} (SO_2 \text{---} C_3F_7)$$

$$NH_4^+ \bullet (C_4F_9 \text{---} SO_2) \text{---} N^- \text{---} (SO_2 \text{---} C_4F_9)$$

Among these compounds, a compound represented by the following chemical formula is particularly preferable from the viewpoint of suppressing or reducing adhesion of fine particles to enable micromachining while suppressing the addition amount of the compound.

$$NH_4^+ \bullet (C_4F_9 \text{---} SO_2) \text{---} N^- \text{---} (SO_2 \text{---} C_4F_9)$$

The compound represented by the chemical formula (1) may be present in the micromachining processing agent in a liquid state (that is, a melted state), or may be present in a state in which the solid compound is dissolved in the micromachining processing agent.

The content of the compound represented by the chemical formula (1) is in a range of 0.001 mass % or more and 0.5 mass % or less, and preferably in a range of 0.001 mass % or more and 0.03 mass % or less, with respect to the total mass of the micromachining processing agent. When the content of the compound represented by the chemical formula (1) is 0.001 mass % or more, it is possible to suppress or reduce adhesion of fine particles (impurities) of an organic substance and an inorganic substance such as metals to an object to be processed. On the other hand, when the content of the compound represented by the chemical formula (1) is 0.5 mass % or less, it is possible to suppress or reduce an increase in micelles formed by aggregation of the compound represented by the chemical formula (1). As a result, it is possible to prevent micelles from adhering to and remaining on the surface of the object to be processed, so that the production cost in the semiconductor production process is reduced, which is economically useful.

In the present embodiment, hydrogen fluoride and ammonium fluoride are blended in the micromachining processing agent in order to enable micromachining of the object to be processed, and are not blended only to adjust the pH of the micromachining processing agent or improve the solubility of other components in water or the like.

The content of hydrogen fluoride is in a range of 0.05 mass % or more and 25 mass % or less, preferably 0.05 mass % or more and 3 mass % or less, with respect to the total mass of the micromachining processing agent. When the content of hydrogen fluoride is 0.05 mass % or more, for example, micromachining such as wet etching can be performed on the silicon-containing insulating film. In addition, when the content of hydrogen fluoride is 25 mass % or less, it is possible to prevent deterioration of the controllability of micromachining such as wet etching due to excessive increase in the etch rate for the silicon-containing insulating film.

The content of ammonium fluoride is in a range of 0.5 mass % or more and 40 mass % or less, preferably 0.5 mass % or more and 30 mass % or less, with respect to the total mass of the micromachining processing agent. When the content of ammonium fluoride is within the above range, it is possible to suppress or reduce a change in the etch rate for the silicon-containing insulating film due to a change in the composition of the micromachining processing agent accompanying evaporation of the micromachining processing agent at the time of use. When the content of ammonium fluoride is 0.5 mass % or more, the concentration of ammonium fluoride can be controlled, thus making it possible to suppress an increase in variation in the etch rate for the silicon-containing insulating film. In addition, when the content of ammonium fluoride is 40 mass % or less, it is possible to suppress or prevent ammonium fluoride from being decomposed into hydrofluoric acid and ammonia due to evaporation of the micromachining processing agent at the time of use, and ammonia gas from being evaporated. This makes it possible to prevent the content (absolute amount) of ammonium fluoride from decreasing and the content (absolute amount) of hydrogen fluoride from increasing, and to prevent the change in the composition of the micromachining processing agent and the change in the etching rate for the silicon-containing insulating film from increasing.

When the content of hydrogen fluoride in the micromachining processing agent according to the present embodiment is X mass % and the content of ammonium fluoride is Y mass %, the following relational expression (1) is satisfied.

[Mathematical Formula 2]

$$Y \leqq -0.8X + 40 \tag{1}$$

where X represents a concentration (mass %) of hydrogen fluoride and Y represents a concentration (mass %) of ammonium fluoride.

Thereby, crystallization of optional components contained in the micromachining processing agent at room temperature can be suppressed. In the present specification, the term "room temperature" means a temperature in a range of 5° C. to 35° C.

In addition, in the case of using buffered hydrofluoric acid which is a mixed solution of hydrofluoric acid and ammonium fluoride in the production of the micromachining processing agent (details will be described later), the higher the content of acidic ammonium fluoride containing hydrofluoric acid and ammonium fluoride at an equimolar number and the content of ammonium fluoride, the higher the temperature at which crystals of optional components are generated in the micromachining processing agent. The deposited crystals become a factor of particles, and further become a factor of changing the concentration of components of the micromachining processing agent. Therefore, it is preferable that the contents of hydrogen fluoride and ammonium fluoride are set within the above-described ranges such that crystals of optional components are not deposited at a temperature at the time of using the micromachining processing agent (for example, in a general semiconductor production process, a semiconductor is produced in an environment of 20° C. to 25° C.).

In the micromachining processing agent according to the present embodiment, water is not particularly limited, but pure water, ultrapure water, and the like are preferable.

The content of water is preferably in a range of 54.500 mass % or more and 99.449 mass % or less, and more preferably 86.970 mass % or more and 99.449 mass % or less, with respect to the total mass of the micromachining processing agent.

The micromachining processing agent of the present embodiment can also contain other additives within a range not inhibiting the effect of the present invention, in addition to an embodiment in which the micromachining processing agent contains only the compound represented by the chemical formula (1), hydrogen fluoride, ammonium fluoride, and water. Examples of the other additive include hydrogen peroxide and a chelating agent.

A method for producing a micromachining processing agent according to the present embodiment is not particularly limited, and various methods can be employed. For example, the micromachining processing agent of the present embodiment can be prepared by preparing buffered hydrofluoric acid containing hydrofluoric acid and ammonium fluoride in advance, and then adding a compound represented by the chemical formula (1) to the buffered hydrofluoric acid. The micromachining processing agent of the present embodiment can also be prepared by adding a compound represented by the chemical formula (1) to any one of hydrofluoric acid, ammonium fluoride and water, and then adding other components in any order or simultaneously.

As described above, the micromachining processing agent according to the present embodiment enables favorable micromachining on an object to be processed having at least a silicon-containing insulating film while reducing or preventing fine particles from remaining on the object to be processed. The micromachining processing agent of the present embodiment enables micromachining processing on even fine particles having a small particle size while preventing the fine particles from remaining on the surface of an object to be processed. Therefore, the micromachining processing agent of the present embodiment is suitable for micromachining processing in the production process of a semiconductor device or the like in which high integration and miniaturization are in progress.

(Micromachining Processing Method)

Next, a micromachining processing method using the micromachining processing agent of the present embodiment will be described below.

The micromachining processing method of the present embodiment is suitable for performing micromachining on an object to be processed having at least a silicon-containing insulating film.

The micromachining processing agent of the present embodiment is employed in various wet etching methods. Examples of the wet etching method include a batch method and a single wafer method, and the micromachining processing agent of the present invention can be employed in any method. In the case of the batch wet etching method, a large amount of wafers can be wet-etched at a time, and the batch wet etching method is excellent in terms of throughput accordingly. However, in the semiconductor production process in which miniaturization of the semiconductor element progresses, there is a problem of cross contamination in an etching tank. On the other hand, in the case of the single wafer wet etching method, there is little concern of cross contamination as in the batch wet etching method, but the single wafer wet etching method is inferior to the batch wet etching method in terms of throughput.

Examples of the method for bringing the micromachining processing agent into contact with an object to be processed include an immersion method and a spray method. Among these contact methods, the immersion method is suitable because the method can reduce or suppress a change in the composition due to evaporation of the micromachining processing agent during the process.

The etching temperature (that is, the liquid temperature of the micromachining processing agent) in the case of using the micromachining processing agent as an etching solution is not particularly limited, but is usually in a range of 15° C. to 35° C., and preferably in a range of 20° C. to 30° C. When the etching temperature is 15° C. or higher, it is possible to suppress crystallization of optional components contained in the micromachining processing agent and to prevent an increase in crystallized particles in the micromachining processing agent due to a decrease in the etch rate. On the other hand, when the etching temperature is 35° C. or lower, evaporation of the micromachining processing agent can be suppressed, thus making it possible to prevent a change in the composition of the micromachining processing agent. In addition, it is possible to prevent the etch rate from being difficult to control due to evaporation of the micromachining processing agent.

When the micromachining processing agent is used as an etching solution, the etching rate for the thermal silicon oxide film at 25° C. (etching temperature, i.e. the liquid temperature of the micromachining processing agent) is preferably in a range of 0.5 nm/min to 700 nm/min, and more preferably in a range of 1.5 nm/min to 650 nm/min. When the etch rate is 0.5 nm/min or more, the time required for micromachining processing such as wet etching on the thermal silicon oxide film is shortened, thus making it possible to suppress a decrease in processing efficiency. On the other hand, when the etch rate is 700 nm/min or less, it is possible to prevent a decrease in controllability of the film thickness of the thermal silicon oxide film after wet etching, and to thereby maintain practicability as an etching solution in the semiconductor production process.

Examples of the object to be processed include substrates made of silicon, germanium, GaAs, InP, and other group III to V and group II to VI compound semiconductors. Further, the substrate may be provided with a layer including silicon, polysilicon, a metal and an oxide thereof, a resist, a mask, and the like.

The silicon-containing insulating film is not particularly limited as long as it is an insulating film containing silicon (Si). Specific examples of the silicon-containing insulating film include a natural oxide film, a chemical oxide film, a thermal silicon oxide film, a non-doped silicate glass film, a phosphorus-doped silicate glass film, a boron-doped silicate glass film, a phosphorus boron-doped silicate glass film, a tetraethyl orthosilicate (TEOS) film, a fluorine-containing silicon oxide film, a carbon-containing silicon oxide film, a nitrogen-containing silicon oxide film, a silicon nitride film, a silicon carbide film, a silicon oxide carbide film, a silicon oxide carbide nitride film, a spin on glass (SOG) film, and a spin on dielectronic (SOD) film.

The natural oxide film in the silicon-containing insulating film is a silicon oxide film formed on silicon during exposure to the atmosphere at room temperature. The chemical oxide film is, for example, a film formed on silicon during cleaning with sulfuric acid/hydrogen peroxide water. The thermal silicon oxide film is a film formed at a high temperature of 800 to 1,000° ° C. by supplying water vapor or oxygen gas. The non-doped silicate glass film, the phosphorus-doped silicate glass film, the boron-doped silicate glass film, the phosphorus boron-doped silicate glass film, the TEOS film, the fluorine-containing silicon oxide film, the carbon-containing silicon oxide film, and the nitrogen-containing silicon oxide film are silicon oxide films formed by supplying a raw material gas such as silane gas, and depositing by chemical vapor deposition (CVD). The SOG film and the SOD film are films formed by a coating method such as a method using a spin coater.

Non-limiting examples of the CVD include film formation methods such as plasma enhanced chemical vapor deposition (PECVD), atomic layer deposition (ALD), metal organic chemical vapor deposition (MOCVD), catalytic chemical vapor deposition (Cat-CVD), thermal CVD, and epitaxial CVD.

As described above, the micromachining processing method of the present embodiment enables micromachining such as wet etching on an object to be processed having at least a silicon-containing insulating film while suppressing adhesion of fine particles. Therefore, the micromachining processing method of the present embodiment is suitable for producing, for example, a semiconductor device, a liquid crystal display device, and a micromachine device.

EXAMPLES

Hereinafter, preferred examples of the present invention will be exemplarily described in detail. However, the scope of the present invention is not limited to the materials, the blending amounts, and the like described in the examples unless otherwise limited.

Example 1

0.0015 mass % of $H^+ \cdot (C_4F_9—SO_2)—N^- (SO_2—C_4F_9)$, 6.0 mass % of hydrofluoric acid (high purity grade for semiconductors, manufactured by Stella Chemifa Corporation, concentration: 50 mass %), 25.0 mass % of ammonium fluoride (high purity grade for semiconductors, manufactured by Stella Chemifa Corporation, concentration: 40 mass %), and 68.9985 mass % of water were mixed and stirred. The temperature of the mixed solution was adjusted so that the liquid temperature was 25° C., and the mixed solution was left to stand for several hours. As a result, an etching solution (micromachining processing agent) containing 0.0015 mass % of $H^+ \cdot (C_4F_9—SO_2)—N^- (SO_2—C_4F_9)$, 3.0 mass % of hydrogen fluoride, and 10.0 mass % of ammonium fluoride was prepared.

Example 2

0.006 mass % of $H^+ \cdot (C_4F_9—SO_2)—N^- (SO_2—C_4F_9)$, 0.2 mass % of hydrofluoric acid (high purity grade for semiconductors, manufactured by Stella Chemifa Corporation, concentration: 50 mass %), 12.5 mass % of ammonium fluoride (high purity grade for semiconductors, manufactured by Stella Chemifa Corporation, concentration: 40 mass %), and 87.294 mass % of water were mixed and stirred. The temperature of the mixed solution was adjusted so that the liquid temperature was 25° C., and the mixed solution was left to stand for several hours. As a result, an etching solution (micromachining processing agent) containing 0.006 mass % of $H^+ \cdot (C_4F_9—SO_2)—N^- (SO_2—C_4F_9)$, 0.1 mass % of hydrogen fluoride, and 5.0 mass % of ammonium fluoride was prepared.

Example 3

0.018 mass % of $H^+ \cdot (C_4F_9—SO_2)—N^- (SO_2—C_4F_9)$, 0.2 mass % of hydrofluoric acid (high purity grade for semiconductors, manufactured by Stella Chemifa Corporation, concentration: 50 mass %), 12.5 mass % of ammonium fluoride (high purity grade for semiconductors, manufactured by Stella Chemifa Corporation, concentration: 40 mass %), and 87.282 mass % of water were mixed and stirred. The temperature of the mixed solution was adjusted so that the liquid temperature was 25° C., and the mixed solution was left to stand for several hours. As a result, an etching solution (micromachining processing agent) containing 0.018 mass % of $H^+ \cdot (C_4F_9—SO_2)—N^- (SO_2—C_4F_9)$, 0.1 mass % of hydrogen fluoride, and 5.0 mass % of ammonium fluoride was prepared.

Example 4

0.006 mass % of $NH^{4+} \cdot (C_4F_9—SO_2)—N^- (SO_2—C_4F_9)$, 1.0 mass % of hydrofluoric acid (high purity grade for semiconductors, manufactured by Stella Chemifa Corporation, concentration: 50 mass %), 5.0 mass % of ammonium fluoride (high purity grade for semiconductors, manufactured by Stella Chemifa Corporation, concentration: 40 mass %), and 93.994 mass % of water were mixed and stirred. The temperature of the mixed solution was adjusted so that the liquid temperature was 25° C., and the mixed solution was left to stand for several hours. As a result, an etching solution (micromachining processing agent) containing 0.006 mass % of $NH^{4+} \cdot (C_4F_9—SO_2)—N^- (SO_2—C_4F_9)$, 0.5 mass % of hydrogen fluoride, and 2.0 mass % of ammonium fluoride was prepared.

Example 5

0.02 mass % of $H^+ \cdot (C_4F_9—SO_2)—N^- (SO_2—C_4F_9)$, 1.0 mass % of hydrofluoric acid (high purity grade for semiconductors, manufactured by Stella Chemifa Corporation, concentration: 50 mass %), 3.75 mass % of ammonium fluoride (high purity grade for semiconductors, manufactured by Stella Chemifa Corporation, concentration: 40 mass %), and 95.23 mass % of water were mixed and stirred. The temperature of the mixed solution was adjusted so that the liquid temperature was 25° C., and the mixed solution was left to stand for several hours. As a result, an etching solution (micromachining processing agent) containing 0.02 mass % of $H^+\cdot(C_4F_9—SO_2)—N^-(SO_2—C_4F_9)$, 0.5 mass % of hydrogen fluoride, and 1.5 mass % of ammonium fluoride was prepared.

Example 6

0.01 mass % of $H^+\cdot(C_4F_9—SO_2)—N^-(SO_2—C_4F_9)$, 50 mass % of hydrofluoric acid (high purity grade for semiconductors, manufactured by Stella Chemifa Corporation, concentration: 50 mass %), 5.0 mass % of ammonium fluoride (high purity grade for semiconductors, manufactured by Stella Chemifa Corporation, concentration: 40 mass %), and 44.99 mass % of water were mixed and stirred. The temperature of the mixed solution was adjusted so that the liquid temperature was 25° C., and the mixed solution was left to stand for several hours. As a result, an etching solution (micromachining processing agent) containing 0.01 mass % of $H^+\cdot(C_4F_9—SO_2)—N^-(SO_2—C_4F_9)$, 25.0 mass % of hydrogen fluoride, and 2.0 mass % of ammonium fluoride was prepared.

Example 7

0.03 mass % of $H^+\cdot(C_2F_5—SO_2)—N^-(SO_2—C_2F_5)$, 45.45 mass % of hydrofluoric acid (high purity grade for semiconductors, manufactured by Stella Chemifa Corporation, concentration: 55 mass %), 50.0 mass % of ammonium fluoride (high purity grade for semiconductors, manufactured by Stella Chemifa Corporation, concentration: 40 mass %), and 4.52 mass % of water were mixed and stirred. The temperature of the mixed solution was adjusted so that the liquid temperature was 25° C., and the mixed solution was left to stand for several hours. As a result, an etching solution (micromachining processing agent) containing 0.03 mass % of $H^+\cdot(C_2F_5—SO_2)—N^-(SO_2—C_2F_5)$, 25.0 mass % of hydrogen fluoride, and 20.0 mass % of ammonium fluoride was prepared.

Example 8

0.1 mass % of $H^+\cdot(C_2F_5—SO_2)—N^-(SO_2—C_2F_5)$, 40.0 mass % of hydrofluoric acid (high purity grade for semiconductors, manufactured by Stella Chemifa Corporation, concentration: 50 mass %), 25.0 mass % of ammonium fluoride (high purity grade for semiconductors, manufactured by Stella Chemifa Corporation, concentration: 40 mass %), and 34.9 mass % of water were mixed and stirred. The temperature of the mixed solution was adjusted so that the liquid temperature was 25° C., and the mixed solution was left to stand for several hours. As a result, an etching solution (micromachining processing agent) containing 0.1 mass % of $H^+\cdot(C_2F_5—SO_2)—N^-(SO_2—C_2F_5)$, 20.0 mass % of hydrogen fluoride, and 10.0 mass % of ammonium fluoride was prepared.

Example 9

0.2 mass % of $H^+\cdot(CF_3—SO_2)—N^-(SO_2—CF_3)$, 38.7 mass % of ammonium fluoride (high purity grade for semiconductors, manufactured by Stella Chemifa Corporation, concentration: 100 mass %), 1.4 mass % of acidic ammonium fluoride (high purity grade for semiconductors, manufactured by Stella Chemifa Corporation, concentration: 100 mass %), and 60.1 mass % of water were mixed and stirred. The temperature of the mixed solution was adjusted so that the liquid temperature was 25° C., and the mixed solution was left to stand for several hours. As a result, an etching solution (micromachining processing agent) containing 0.2 mass % of $H^+\cdot(CF_3—SO_2)—N^-(SO_2—CF_3)$, 0.5 mass % of hydrogen fluoride, and 39.6 mass % of ammonium fluoride was prepared.

Example 10

0.3 mass % of $H^+\cdot(C_2F_5—SO_2)—N^-(SO_2—C_2F_5)$, 28.0 mass % of hydrofluoric acid (high purity grade for semiconductors, manufactured by Stella Chemifa Corporation, concentration: 50 mass %), 50.0 mass % of ammonium fluoride (high purity grade for semiconductors, manufactured by Stella Chemifa Corporation, concentration: 40 mass %), and 21.7 mass % of water were mixed and stirred. The temperature of the mixed solution was adjusted so that the liquid temperature was 25° C., and the mixed solution was left to stand for several hours. As a result, an etching solution (micromachining processing agent) containing 0.3 mass % of $H^+\cdot(C_2F_5—SO_2)—N^-(SO_2—C_2F_5)$, 14.0 mass % of hydrogen fluoride, and 20.0 mass % of ammonium fluoride was prepared.

Example 11

0.4 mass % of $H^+\cdot(CF_3—SO_2)—N^-(SO_2—CF_3)$, 15.1 mass % of hydrofluoric acid (high purity grade for semiconductors, manufactured by Stella Chemifa Corporation, concentration: 55 mass %), 83.3 mass % of ammonium fluoride (high purity grade for semiconductors, manufactured by Stella Chemifa Corporation, concentration: 40 mass %), and 1.3 mass % of water were mixed and stirred. The temperature of the mixed solution was adjusted so that the liquid temperature was 25° C., and the mixed solution was left to stand for several hours. As a result, an etching solution (micromachining processing agent) containing 0.4 mass % of $H^+\cdot(CF_3—SO_2)—N^-(SO_2—CF_3)$, 8.3 mass % of hydrogen fluoride, and 33.3 mass % of ammonium fluoride was prepared.

Comparative Example 1

0.2 mass % of hydrofluoric acid (high purity grade for semiconductors, manufactured by Stella Chemifa Corporation, concentration: 50 mass %), 12.5 mass % of ammonium fluoride (high purity grade for semiconductors, manufactured by Stella Chemifa Corporation, concentration: 40 mass %), and 87.3 mass % of ultrapure water were mixed and stirred. The temperature of the mixed solution was adjusted so that the liquid temperature was 25° C., and the mixed solution was left to stand for several hours. As a result, an etching solution (micromachining processing agent) containing 0.1 mass % of hydrogen fluoride, and 5.0 mass % of ammonium fluoride was prepared.

Comparative Example 2

0.006 mass % of $C_8H_{17}—(O—CH_2)_3NH_2$, 0.2 mass % of hydrofluoric acid (high purity grade for semiconductors, manufactured by Stella Chemifa Corporation, concentration: 50 mass %), 12.5 mass % of ammonium fluoride (high purity grade for semiconductors, manufactured by Stella Chemifa Corporation, concentration: 40 mass %), and 87.294 mass % of water were mixed and stirred. The temperature of the mixed solution was adjusted so that the liquid temperature was 25° C., and the mixed solution was left to stand for several hours. As a result, an etching solution (micromachining processing agent) containing 0.006 mass % of $C_8H_{17}$—(O—$CH_2$)$_3NH_2$, 0.1 mass % of hydrogen fluoride, and 5.0 mass % of ammonium fluoride was prepared.

Comparative Example 3

0.15 mass % of $H^+·(C_2F_5$—$SO_2)$—$N^-(SO_2$—$C_2F_5)$, 7.58 mass % of hydrofluoric acid (high purity grade for semiconductors, manufactured by Stella Chemifa Corporation, concentration: 50 mass %), 46.21 mass % of acidic ammonium fluoride (high purity grade for semiconductors, manufactured by Stella Chemifa Corporation, concentration: 100 mass %), and 46.06 mass % of water were mixed and stirred. The temperature of the mixed solution was adjusted so that the liquid temperature was 25° C., and the mixed solution was left to stand for several hours. As a result, an etching solution (micromachining processing agent) containing 0.15 mass % of $H^+·(C_2F_5$—$SO_2)$—$N^-(SO_2$—$C_2F_5)$, 20.0 mass % of hydrogen fluoride, and 30.0 mass % of ammonium fluoride was prepared.

Comparative Example 4

0.3 mass % of $H^+·(CF_3$—$SO_2)$—$N^-(SO_2$—$CF_3)$, 19.5 mass % of ammonium fluoride (high purity grade for semiconductors, manufactured by Stella Chemifa Corporation, concentration: 100 mass %), 28.5 mass % of acidic ammonium fluoride (high purity grade for semiconductors, manufactured by Stella Chemifa Corporation, concentration: 100 mass %), and 51.7 mass % of water were mixed and stirred. The temperature of the mixed solution was adjusted so that the liquid temperature was 25° C., and the mixed solution was left to stand for several hours. As a result, an etching solution (micromachining processing agent) containing 0.3 mass % of $H^+·(CF_3$—$SO_2)$—$N^-(SO_2$—$CF_3)$, 10.0 mass % of hydrogen fluoride, and 38.0 mass % of ammonium fluoride was prepared.

Comparative Example 5

0.4 mass % of $H^+·(C_2F_5$—$SO_2)$—$N^-(SO_2$—$C_2F_5)$, 60.0 mass % of hydrofluoric acid (high purity grade for semiconductors, manufactured by Stella Chemifa Corporation, concentration: 50 mass %), 37.5 mass % of ammonium fluoride (high purity grade for semiconductors, manufactured by Stella Chemifa Corporation, concentration: 40 mass %), and 2.1 mass % of water were mixed and stirred. The temperature of the mixed solution was adjusted so that the liquid temperature was 25° C., and the mixed solution was left to stand for several hours. As a result, an etching solution (micromachining processing agent) containing 0.4 mass % of $H^+·(C_2F_5$—$SO_2)$—$N^-(SO_2$—$C_2F_5)$, 30.0 mass % of hydrogen fluoride, and 15.0 mass % of ammonium fluoride was prepared.

Comparative Example 6

0.7 mass % of $H^+·(C_2F_5$—$SO_2)$—$N^-(SO_2$—$C_2F_5)$, 10.0 mass % of hydrofluoric acid (high purity grade for semiconductors, manufactured by Stella Chemifa Corporation, concentration: 50 mass %), 50.0 mass % of ammonium fluoride (high purity grade for semiconductors, manufactured by Stella Chemifa Corporation, concentration: 40 mass %), and 39.3 mass % of water were mixed and stirred. The temperature of the mixed solution was adjusted so that the liquid temperature was 25° C., and the mixed solution was left to stand for several hours. As a result, an etching solution (micromachining processing agent) containing 0.7 mass % of $H^+·(C_2F_5$—$SO_2)$—$N^-(SO_2$—$C_2F_5)$, 5.0 mass % of hydrogen fluoride, and 20.0 mass % of ammonium fluoride was prepared.

Comparative Example 7

0.0005 mass % of $H^+·(CF_3$—$SO_2)$—$N^-(SO_2$—$CF_3)$, 38.6740 mass % of ammonium fluoride (high purity grade for semiconductors, manufactured by Stella Chemifa Corporation, concentration: 100 mass %), 1.4255 mass % of acidic ammonium fluoride (high purity grade for semiconductors, manufactured by Stella Chemifa Corporation, concentration: 100 mass %), and 59.9000 mass % of water were mixed and stirred. The temperature of the mixed solution was adjusted so that the liquid temperature was 25° C., and the mixed solution was left to stand for several hours. As a result, an etching solution (micromachining processing agent) containing 0.0005 mass % of $H^+·(CF_3$—$SO_2)$—$N^-(SO_2$—$CF_3)$, 0.5 mass % of hydrogen fluoride, and 39.6 mass % of ammonium fluoride was prepared.

(Evaluation of Presence or Absence of Crystals)

The liquid temperatures of the etching solutions of Examples 1 to 11 and Comparative Examples 1 to 7 after removing fine particles were changed, and the temperature at which crystals were deposited in the etching solution was measured. The results are shown in Table 1.

(Measurement of Etch Rate for Thermal Silicon Oxide Film)

The film thicknesses of the thermal silicon oxide film before and after wet etching processing were measured with an optical film thickness measuring device (Nanospec M6100, manufactured by Nanometrics Japan Ltd.), and a change in the film thickness due to etching was measured. The measurement was repeatedly performed at three different etching times, and the etching rate at an etching temperature of 25° C. (the liquid temperature of the etching solution) was calculated for each etching solution in which crystals were deposited at a temperature of 30° C. or lower in Examples 1 to 11 and Comparative Examples 1 to 7. The results are shown in Table 1.

(Removal of Fine Particles in Etching Solution)

In Examples 1 to 11 and Comparative Examples 1 to 7, fine particles present in the etching solution were removed from the etching solution in which the temperature at which crystals were deposited was 30° C. or lower, the etching rate for the thermal silicon oxide film was in a range of 0.5 nm/min to 700 nm/min, and cloudiness due to generation of micelles did not occur. Specifically, each etching solution was subjected to circulation filtration with a filter (Etch Guard HP, manufactured by Entegris, Inc., pore size: 0.1 μm) to remove fine particles contained in the etching solution. The circulation filtration of the etching solution was performed until the number of particles having a particle size of 0.06 μm or more reached 10 particles/mL or less. The number of particles in the etching solution is a value measured by a laser light scattering method (liquid-borne particle counter KS-19F, manufactured by RION Co., Ltd).

(Preparation of Pseudo-Contaminated Etching Solution)

Next, in order to evaluate adhesion of fine particles to the surface of the silicon wafer or the like, a generally used polystyrene latex (manufactured by Thermo Fisher Scientific Inc., particle size: 0.100 µm, concentration: $3 \times 10^8$ particles/mL) was prepared. The polystyrene latex was added to each of the etching solutions of Examples 1 to 11 and Comparative Examples 1 to 2 and 7 subjected to the circulation filtration, to prepare an etching solution in a state of being pseudo-contaminated with the polystyrene latex at a contamination concentration of 3,000 particles/mL.

(Wet Etching Processing)

Subsequently, a silicon wafer (manufactured by SUMCO Corporation, diameter: 8 inches, plane orientation (100), resistivity: 10 Ω·cm, number of adhered particles having a particle size of 0.079 µm or more: 10 or less) having a thermal silicon oxide film (film thickness: 0.002 µm) formed on the surface thereof was prepared as an object to be processed. The silicon wafer was subjected to batch wet etching processing using each of the etching solutions of Examples 1 to 11 and Comparative Examples 1 to 2 and 7 to which the polystyrene latex was added. The wet etching processing was performed such that the silicon wafer was immersed in an etching tank filled with each etching solution to etch the thermal silicon oxide film, and the surface of the silicon wafer was directly exposed to the etching solution for 1 minute. The liquid temperature of the etching solution was 25° C. Further, the silicon wafer was taken out from the etching tank, immersed in a rinse tank in which ultrapure water overflows, and cleaned in the rinse tank for 10 minutes. Thereafter, the silicon wafer was taken out from the rinse tank and dried.

(Measurement of Number of Fine Particles Adhered to Silicon Wafer Surface after Wet Etching Processing)

The number of fine particles adhering to the surface of the silicon wafer after wet etching processing was measured with a wafer surface analyzer (WM-2500, manufactured by TOPCON Corporation). The fine particles to be measured had a particle size of 0.079 µm or more. The results are shown in Table 1.

TABLE 1

| | Composition of etching solution | | | | Crystal deposition temperature (° C.) | Etch rate for thermal silicon oxide film, liquid temperature 25° C. (nm/min) | Number of fine particles having particle size of 0.079 µm or more on silicon wafer surface (particles/8 inch wafer) (Polystyrene latex: particle size: 0.1 µm, contamination concentration: 3,000/mL, liquid temperature: 25° C.) |
|---|---|---|---|---|---|---|---|
| | Surfactant (mass %) | | Hydrogen fluoride (mass %) | Ammonium fluoride (mass %) | | | |
| Example 1 | $H^+\bullet(C_4F_9{-}SO_2){-}N^-{-}(SO_2{-}C_4F_9)$ | 0.0015 | 3.0 | 10.0 | <0 | 61.5 | 18 |
| Example 2 | $H^+\bullet(C_4F_9{-}SO_2){-}N^-{-}(SO_2{-}C_4F_9)$ | 0.006 | 0.1 | 5.0 | <0 | 2.1 | 18 |
| Example 3 | $H^+\bullet(C_4F_9{-}SO_2){-}N^-{-}(SO_2{-}C_4F_9)$ | 0.018 | 0.1 | 5.0 | <0 | 2.1 | 15 |
| Example 4 | $NH^{4+}\bullet(C_4F_9{-}SO_2){-}N^-{-}(SO_2{-}C_4F_9)$ | 0.006 | 0.5 | 2.0 | <0 | 8.6 | 23 |
| Example 5 | $H^+\bullet(C_4F_9{-}SO_2){-}N^-{-}(SO_2{-}C_4F_9)$ | 0.02 | 0.5 | 1.5 | <0 | 8.2 | 14 |
| Example 6 | $H^+\bullet(C_4F_9{-}SO_2){-}N^-{-}(SO_2{-}C_4F_9)$ | 0.01 | 25.0 | 2.0 | <0 | 330.0 | 52 |
| Example 7 | $H^+\bullet(C_2F_5{-}SO_2){-}N^-{-}(SO_2{-}C_2F_5)$ | 0.03 | 25.0 | 20.0 | 4 | 674.2 | 37 |
| Example 8 | $H^+\bullet(C_2F_5{-}SO_2){-}N^-{-}(SO_2{-}C_2F_5)$ | 0.1 | 20.0 | 10.0 | <0 | 381.0 | 31 |
| Example 9 | $H^+\bullet(CF_3{-}SO_2){-}N^-{-}(SO_2{-}CF_3)$ | 0.2 | 0.5 | 39.6 | <0 | 9.2 | 25 |
| Example 10 | $H^+\bullet(C_2F_5{-}SO_2){-}N^-{-}(SO_2{-}C_2F_5)$ | 0.3 | 14.0 | 20.0 | 4 | 349.2 | 57 |
| Example 11 | $H^+\bullet(CF_3{-}SO_2){-}N^-{-}(SO_2{-}CF_3)$ | 0.4 | 8.3 | 33.3 | 18 | 141.0 | 45 |
| Comparative Example 1 | — | — | 0.1 | 5.0 | <0 | 2.1 | 700 |
| Comparative Example 2 | $C_8H_{17}{-}(O{-}CH_2)_3NH_2$ | 0.006 | 0.1 | 5.0 | <0 | 2.1 | 1054 |
| Comparative Example 3 | $H^+\bullet(C_2F_5{-}SO_2){-}N^-{-}(SO_2{-}C_2F_5)$ | 0.15 | 20.0 | 30.0 | >30 | Not measurable due to crystal deposition | Not measurable due to crystal deposition |
| Comparative Example 4 | $H^+\bullet(CF_3{-}SO_2){-}N^-{-}(SO_2{-}CF_3)$ | 0.3 | 10.0 | 38.0 | >30 | Not measurable due to crystal deposition | Not measurable due to crystal deposition |
| Comparative Example 5 | $H^+\bullet(C_2F_5{-}SO_2){-}N^-{-}(SO_2{-}C_2F_5)$ | 0.4 | 30.0 | 15.0 | <0 | 812.2 | No measurement due to high etch rate |
| Comparative Example 6 | $H^+\bullet(C_2F_5{-}SO_2){-}N^-{-}(SO_2{-}C_2F_5)$ | 0.7 | 5.0 | 20.0 | <0 | 102.5 | Not measurable due to cloudiness |
| Comparative Example 7 | $H^+\bullet(CF_3{-}SO_2){-}N^-{-}(SO_2{-}CF_3)$ | 0.0005 | 0.5 | 39.6 | <0 | 9.2 | 581 |

As is apparent from Table 1, in the etching solutions according to Examples 1 to 11, the thermal silicon oxide film could be wet-etched well while reducing remaining of fine particles having a particle size of 0.079 µm or more. On the other hand, in the etching solutions according to Comparative Examples 1, 2, and 7, it was confirmed that a large amount of fine particles having a particle size of 0.079 µm or more adhered and remained on the surface of the silicon wafer. In the etching solutions according to Comparative Examples 3 and 4, the number of fine particles could not be measured because crystals were deposited. In the etching solution according to Comparative Example 5, the number of fine particles was not measured because the value of the etch rate at 25° C. for the thermal silicon oxide film was too large. Further, in the etching solution according to Comparative Example 6, the number of fine particles could not be measured because the etching solution became cloudy.

The invention claimed is:

1. A micromachining processing agent for micromachining an object to be processed having at least a silicon-containing insulating film, the micromachining processing agent consisting of:

a compound represented by a chemical formula (1) below;
hydrogen fluoride;
ammonium fluoride; and
water,

[Chemical Formula 1]

$$M^+ \cdot (Rf\text{-}SO_2) \!-\!\!-\! N^- \!-\!\!-\! (SO_2\text{-}Rf) \tag{1}$$

wherein Rf represents perfluoroalkyl group having 1 to 4 carbon atoms, and $M^+$ represents a hydrogen ion or an ammonium ion, wherein a content of the compound is 0.001 mass % or more and 0.5 mass % or less with respect to a total mass of the micromachining processing agent, a content of the hydrogen fluoride is 0.05 mass % or more and 25 mass % or less with respect to the total mass of the micromachining processing agent, a content of the ammonium fluoride is 0.5 mass % or more and 40 mass % or less with respect to the total mass of the micromachining processing agent, and the content of the hydrogen fluoride and the content of the ammonium fluoride satisfy a relational expression (1) below:

[Mathematical Formula 1]

$$Y \leqq -0.8X + 40 \tag{1}$$

wherein X represents a concentration (mass %) of hydrogen fluoride and Y represents a concentration (mass %) of ammonium fluoride.

2. The micromachining processing agent according to claim 1, wherein the silicon-containing insulating film is a thermal silicon oxide film, and an etch rate for the thermal silicon oxide film at an etching temperature of 25° C. is 0.5 nm/min to 700 nm/min.

3. The micromachining processing agent according to claim 1, wherein

Rf in the compound represented by the chemical formula (1) is a nonafluorobutyl group, the content of the compound is 0.001 mass % or more and 0.03 mass % or less with respect to the total mass of the micromachining processing agent, the content of the hydrogen fluoride is 0.05 mass % or more and 3 mass % or less with respect to the total mass of the micromachining processing agent, and the content of the ammonium fluoride is 0.5 mass % or more and 10 mass % or less with respect to the total mass of the micromachining processing agent.

4. A micromachining processing method comprising micromachining an object to be processed having at least a silicon-containing insulating film using the micromachining processing agent according to claim 1.

\* \* \* \* \*